(12) United States Patent
Liang et al.

(10) Patent No.: US 7,880,238 B2
(45) Date of Patent: Feb. 1, 2011

(54) 2-T SRAM CELL STRUCTURE AND METHOD

(75) Inventors: Qingqing Liang, Fishkill, NY (US); Werner A. Rausch, Stormville, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 427 days.

(21) Appl. No.: 12/100,441

(22) Filed: Apr. 10, 2008

(65) Prior Publication Data
US 2009/0256205 A1   Oct. 15, 2009

(51) Int. Cl.
*H01L 29/76* (2006.01)
*H01L 29/94* (2006.01)
*H01L 31/062* (2006.01)
*H01L 31/113* (2006.01)

(52) U.S. Cl. .................. 257/393; 257/401; 257/402; 257/903

(58) Field of Classification Search ......... 257/393–402, 257/903, E27.098
See application file for complete search history.

(56) References Cited

U.S. PATENT DOCUMENTS

| 6,545,314 | B2 | 4/2003 | Forbes et al. |
| 6,804,136 | B2 | 10/2004 | Forbes |
| 6,909,635 | B2 | 6/2005 | Forbes et al. |
| 7,038,943 | B2 | 5/2006 | Kaal |
| 7,541,614 | B2 * | 6/2009 | Kato .......................... 257/66 |
| 2004/0207100 | A1 * | 10/2004 | Madurawe .................. 257/903 |

\* cited by examiner

*Primary Examiner*—Cuong Q Nguyen
(74) *Attorney, Agent, or Firm*—Scully, Scott, Murphy & Presser, P.C.; H. Daniel Schnurmann

(57) ABSTRACT

The present invention, in one embodiment, provides a memory device including a substrate including at least one device region; a first field effect transistor having a first threshold voltage and a second field effect transistor having a second threshold voltage, the second field effect transistor including a second active region present in the at least one device region of the substrate, the second active region including a second drain and a second source separated by a second channel region, wherein the second channel region includes a second trap that stores holes produced when the first field effect transistor is in the on state, wherein the holes stored in the second trap increase the second threshold voltage to be greater than the first threshold voltage.

7 Claims, 17 Drawing Sheets

2-T SRAM CELL STRUCTURE AND METHOD

FIELD OF THE INVENTION

The present invention relates to microelectronics. In one embodiment, the present invention relates to a memory device in which the memory function is provided by at least two field effect transistors.

BACKGROUND OF THE INVENTION

Microelectronic circuits for data and/or signal processing contain memories with memory cells that make it possible to store data. As an increasing number of portable systems have come on the market, such as mobile telephones, palm-top computers and medical equipment, the requirements for these memories have become more stringent as processing speed increases. An important example of such memories is the SRAM (Static Random Access Memory), which can be implemented with a small area requirement and allows very rapid access to its content. A static random access memory (SRAM) is a significant memory device due to its high speed, low power consumption, and simple operation. Unlike a dynamic random access memory (DRAM) cell, the SRAM typically does not need to regularly refresh the stored data.

However, SRAM stability is typically impacted by scaling. It is desirable to make the silicon area occupied by the memory cell as small as practical so as to increase the density of the memory array. A memory cell that occupies a small area of silicon permits more memory cells to be fabricated on a single silicon chip of a given size. Hence, there is increasing efforts to scale memory cells and the devices present in memory cells, such as SRAM devices.

Unfortunately, the leakage per area of memory devices, such as SRAM devices, typically increases as device scaling increases. Further, as the device scaling is increased the threshold voltage mismatch ($V_{th}$) increases, which typically results in decreased device stability.

SUMMARY OF THE INVENTION

In one aspect, the present invention provides a memory device. In one embodiment, the memory device utilizes hole traps on the semiconductor isolation region interfaces as the memory function.

Broadly, the memory device includes:

a substrate including at least one device region;

a first field effect transistor having a first threshold voltage, the first field effect transistor including a first active region present in the at least one device region of the substrate, the first active region including a first drain and a first source; and a second field effect transistor having a second threshold voltage, the second field effect transistor including a second active region present in the at least one device region of the substrate, the second active region including a second drain and a second source separated by a second channel region, the second source and the first source are provided by a shared dopant region in the at least one device region, wherein the second channel region includes a second trap that stores holes produced when the first field effect transistor is in the on state, wherein the holes stored in the second trap increase the second threshold voltage to be greater than the first threshold voltage.

In one embodiment, when the first field effect transistor has a first channel separating the first drain from the first source, the first channel includes a first trap. The first channel region extends along a first direction defined by the dimension separating the first drain from the first source that is substantially parallel to the second channel region that extends along a second direction defined by the dimension separating the second drain and the second source.

In one example of the memory device, in which the first field effect transistor includes a first gate structure and the second field effect transistor includes a second gate structure, the first gate structure to the first channel region is positioned on a first side of the at least one device region, and the second gate structure to the second channel region is positioned on a second side of the at least one device region.

The second gate structure may include an oxide containing gate dielectric and the second trap is positioned at an interface of the oxide containing gate dielectric and the second active region.

In one embodiment, the at least one device region has an area of about 0.015 um², and the first active region and the second active region are composed of a Si-containing composition.

In another aspect, the present invention provides a method of manufacturing a memory device. In one embodiment, the method provides a memory device, in which the memory function of the device is provided by hole traps on the semiconductor isolation region interfaces. Broadly, the method of manufacturing a memory device includes:

providing a substrate;

forming at least one device region in the substrate;

forming at least two gate regions in contact with the at least one device region;

forming a common source region for the at least two gate regions to the at least one device region; and forming a first drain region for one of the two gate regions on a first portion of the at least one device region, and a second drain region for an other of the two gate regions on a second portion of the at least one device region.

The forming of the at least one device region in the substrate may include etching the Si-containing substrate to provide at least one Si-containing island.

The forming of the at least one gate region in contact with the at least one device regions may include forming a gate dielectric atop at least one of the Si-containing islands; forming a gate conductor atop the gate dielectric; and removing a portion of the gate conductor and a portion of the gate dielectric that is positioned atop an upper surface of the Si-containing islands, wherein a remaining portion of the gate conductor and the gate dielectric is positioned on a sidewall of the Si-containing islands, and the upper surface of the Si-containing islands is exposed.

The forming of the common source region includes implanting an N-type or P-type dopant. The method may further include forming a contact to the at least two gate regions, the common source region, the first drain region, and the second drain region.

In another aspect, the present invention provides a method of storing memory. In one embodiment, the method of storing memory utilizes the above-described memory devices. Broadly, the method of storing memory includes:

providing a memory cell including a first field effect transistor and a second field effect transistor on a substrate, a first active region of the first field effect transistor and a second active region of the second field effect transistor are present on a device region of the substrate;

writing a value to the memory cell by applying a first voltage to the first gate of the first field effect transistor and a second voltage to the second gate of the second field effect transistor, wherein when the first voltage is greater than the second voltage and is greater than a first threshold voltage of the first field effect transistor, a "1" is written to the memory cell, and when the second voltage is greater than the first voltage and is greater than a second threshold voltage of the second field effect transistor, a "0" is written to the memory cell; and retaining the value by applying a third voltage to a first source of the first field effect transistor and a second source of the second field effect transistor, and applying a fourth voltage to a first gate structure of the first field effect transistor and to a second gate structure of the second field effect transistor, wherein the third voltage is greater than or equal to the fourth voltage.

The method may further include reading the value by applying a fifth voltage to the first gate structure and the second gate structure, and measuring a first current at the first drain and a second current at the second drain, wherein the "1" is stored in the memory device when the second current at the second drain is less than the first current at the first drain, and the "0" is stored in the memory device when the first current at the first drain is less than the second current at the second drain.

In one embodiment of the method of storing memory, the application of the first voltage to the first gate of the first field effect transistor, which is greater than the first threshold voltage of the first field effect transistor, produces holes that are collected in a second trap of the second field effect transistor that is present at a second interface of the gate structure of the second field effect transistor and the region of the substrate in the second active region. The holes that are collected in the second trap of the second field effect transistor can increase the second threshold voltage of the second field effect transistor to be greater than the first threshold voltage of the first field effect transistor. In one embodiment, the holes that are collected in the second trap of the second field effect transistor are produced from impact ionization within the first field effect transistor and are released from a first trap positioned at a first interface of the gate structure of the first field effect transistor and a Si-containing layer of the substrate in which the first active region is present.

An electric field produced by a voltage differential between the first voltage and the second voltage may direct the holes from the first field effect transistor to the second trap of the second field effect transistor. The holes collected at the second trap produce a positively charged surface that increases the second threshold voltage of the second field effect transistor to be greater than the first threshold voltage of the first field effect transistor.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIG. 6A is a top planar view of the initial structure. FIG. 6B is a side cross-sectional view along section line A-A of FIG. 6A.

FIG. 7A is a top planar view. FIG. 7B is a side cross-sectional view along section line A-A of FIG. 7A. FIG. 7B is a side cross-sectional view along section line B-B of FIG. 7A.

FIG. 8A is a top planar view. FIG. 8B is a side cross-sectional view along section line A-A of FIG. 8A. FIG. 8B is a side cross-sectional view along section line B-B of FIG. 8A.

FIG. 9A is a top planar view. FIG. 9B is a side cross-sectional view along section line A-A of FIG. 9A. FIG. 9C is a side cross-sectional view along section line B-B of FIG. 9A.

FIG. 10A is a top planar view. FIG. 10B is a side cross-sectional view along section line A-A of FIG. 10A. FIG. 10C is a side cross-sectional view along section line B-B of FIG. 10A. FIG. 10D is a side cross-sectional view along section line C-C of FIG. 10A.

FIG. 11A is a top planar view. FIG. 11B is a side cross-sectional view along section line A-A of FIG. 11A. FIG. 11C is a side cross-sectional view along section line B-B of FIG. 11A. FIG. 11D is a side cross-sectional view along section line C-C of FIG. 11A. FIG. 11E is a side cross-sectional view along section line D-D of FIG. 11A.

FIG. 12A is a top planar view. FIG. 12B is a side cross-sectional view along section line A-A of FIG. 12A. FIG. 12C is a side cross-sectional view along section line B-B of FIG. 12A. FIG. 12D is a side cross-sectional view along section line C-C of FIG. 12A. FIG. 12E is a side cross-sectional view along section line D-D of FIG. 12A.

FIG. 13A is a top planar view. FIG. 13B is a side cross-sectional view along section line A-A of FIG. 13A. FIG. 13C is a side cross-sectional view along section line B-B of FIG. 13A. FIG. 13D is a side cross-sectional view along section line C-C of FIG. 13A. FIG. 13E is a side cross-sectional view along section line D-D of FIG. 13A.

FIG. 14A is a top planar view. FIG. 14B is a side cross-sectional view along section line A-A of FIG. 14A. FIG. 14C is a side cross-sectional view along section line B-B of FIG. 14A. FIG. 14D is a side cross-sectional view along section line C-C of FIG. 14A. FIG. 14E is a side cross-sectional view along section line D-D of FIG. 14A.

DETAILED DESCRIPTION OF THE INVENTION

Figure 1:
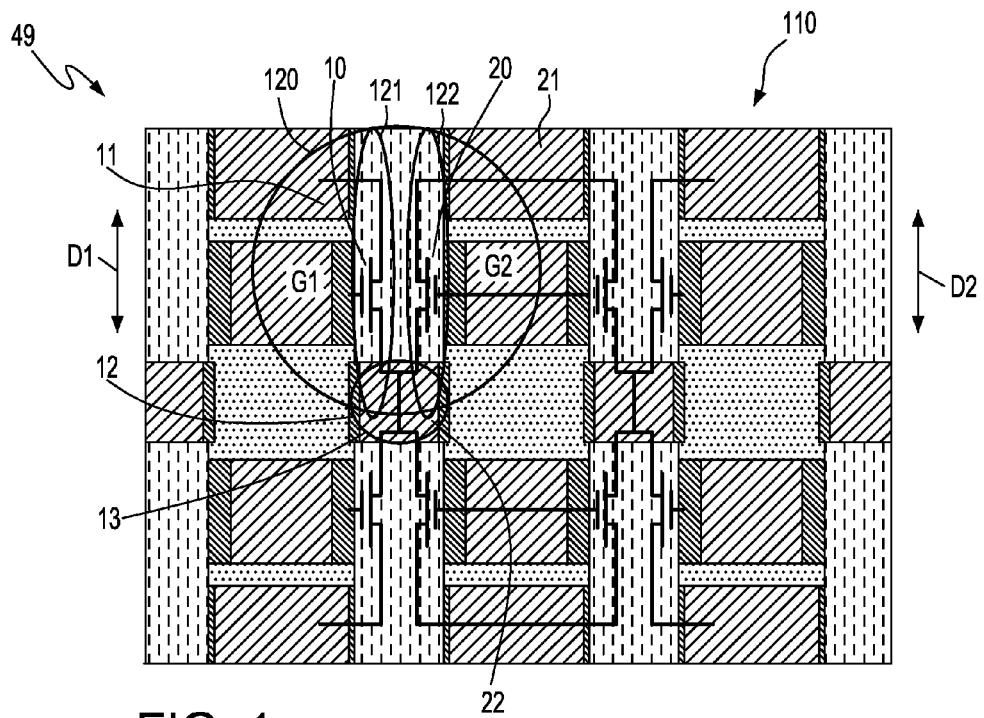
FIG. 1 is a top planar view of one embodiment of a 2-T SRAM cell structure, in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to memory devices that employ hole traps on the interfaces of semiconducting and isolation regions, such as an interface of a silicon region and a silicon oxide region, as the memory function. In one embodiment, the memory devices of the present invention are SRAM memory devices.

As used herein, "semiconductor" refers to an intrinsic semiconductor material that may be doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. In intrinsic semiconductors the valence band and the conduction band are separated by the energy gap that may be as great as about 3.5 eV.

As used herein a "field effect transistor" is a transistor in which output current, i.e., source-drain current, is controlled by the voltage applied to the gate. A field effect transistor has three terminal, i.e, gate, source and drain.

As used herein, the term "drain" means a doped region in semiconductor substrates located at the end of the channel in field effect transistors, in which carriers are flowing out of the transistor through the drain.

As used herein, the term "source" is a doped region from which majority carriers are flowing into the channel.

A "gate structure" means a structure used to control output current (i.e., flow of carriers in the channel) of a semiconducting device, such as a field effect transistor (FET).

As used herein, the term "channel" is the region between the source and drain of a metal oxide semiconductor transistor that becomes conductive when the transistor is turned on.

As used herein, the term "dielectric" denotes a non-metallic material having insulating properties.

As used herein, "insulating" denotes a room temperature conductivity of less than about $10^{-10}$ $(\Omega\text{-m})^{-1}$.

As used herein, "conductive" denotes a room temperature conductivity of greater than about $10^{-8}$ $(\Omega\text{-m})^{-1}$.

As used herein, "threshold voltage" is the lowest attainable voltage that will turn on a transistor, such as a field effect transistor.

A "device region" includes a portion of the substrate on which at least the field effect transistors are positioned.

As used herein, an "active device region" is portion of the device region in which the source, drain and channel of a device are present.

As used herein, a "PFET" refers to a device created by the addition of trivalent impurities to an intrinsic semiconductor to create deficiencies of valence electrons, such as boron, aluminum or gallium to an intrinsic Si substrate.

As used herein, an "NFET" refers to a device created by the addition of pentavalent impurities that contributes free electrons to an intrinsic semiconductor, such as antimony, arsenic or phosphorous to an intrinsic Si substrate.

The term "trap" means a site that retains and stores a hole.

The term "hole" means a positive charge carrier in semiconductors, i.e., a vacant electron state in the valence band of the semiconducting material that is a positive charge carrier in an electric field.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

FIG. 1 depicts one embodiment of a 2-T SRAM cell structure, in accordance with the present invention. SRAM (static RAM) is random access memory (RAM) that retains data bits in its memory as long as power is being supplied. Unlike dynamic RAM (DRAM), which stores bits in cells including a capacitor and a transistor, SRAM does not have to be periodically refreshed.

In one embodiment, the present invention provides a memory device 110, e.g., a SRAM memory device that includes a substrate 49 including at least one device region 120; a first field effect transistor 10 having a first threshold voltage, the first field effect transistor 10 including a first active device region 121 present in the at least one device region 120 of the substrate 49, the first active device region 121 including a first drain 11 and a first source 12; and a second field effect transistor 20 having a second threshold voltage, the second field effect transistor 20 including a second active region 122 present in the at least one device region of the substrate 49, the second active device region 122 including a second drain 21 and a second source 22 separated by a second channel region, the second source 22 and the first source 12 are provided by a shared dopant region 13 (also referred to as common dopant region 13) in the at least one device region 120, wherein the second channel region includes a second trap 50 that stores holes produced when the first field effect transistor 10 is in the on state, wherein the holes stored in the second trap 50 increase the second threshold voltage to be greater than the first threshold voltage.

In one embodiment of the memory device 110, the first channel region extends along a first direction D1 defined by the dimension separating the first drain 11 from the first source 12 that is substantially parallel to the second channel region which extends along a second direction D2 defined by the second drain 21 and the second source 22. The first field effect transistor 10 may include a first gate structure G1 and the second field effect transistor 20 may include a second gate structure G2, the first gate structure G1 corresponding to the first channel region is positioned on a first side of the device region 120, the second gate structure G2 corresponding to the second channel region is positioned on a second side of the device region 120.

In one embodiment, the device region 120 has an area on the order of 150×200 nm² on a 32 nm is on the order of about 40 nm, the gate length (LPOLY) is on the order of about 40 nm, and the CA-PC ground rules are on the order of about 25 nm. In another embodiment, the device region 120 has an area on the order of 100×150 nm² on a 32 nm technology, wherein CA is on the order of about 40 nm, the gate length (LPOLY) is on the order of about 40 nm, and the CA-PC ground rules are on the order of about 25 nm. CA is the stud contact from the first metal level to the terminals of the active region, e.g., source, drain or gate.

Figure 2A:
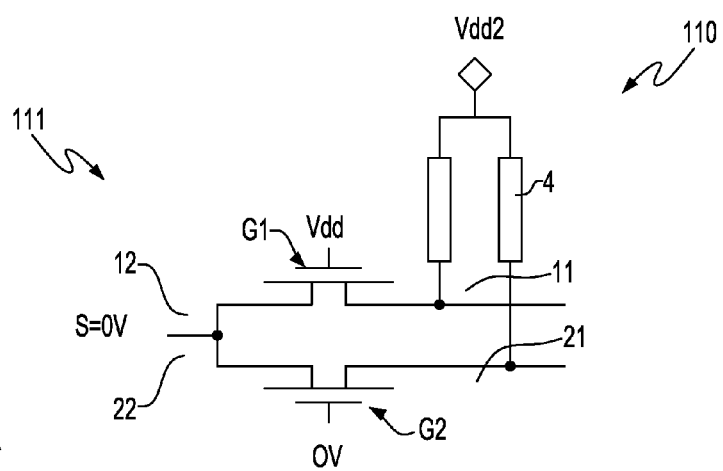
FIGS. 2A-2C are schematic views depicting the operation of one embodiment of a memory cell in write mode, in accordance with the present invention.
Figure 2B:
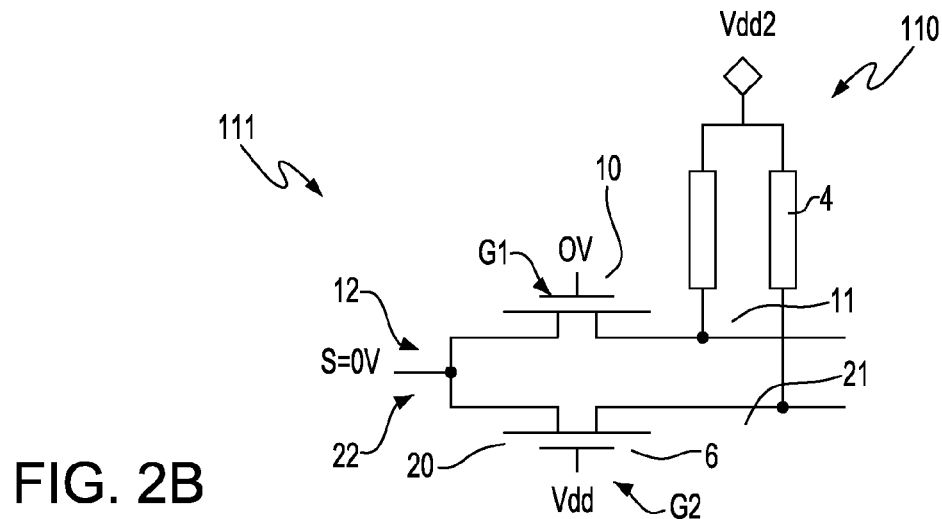
Figure 2C:
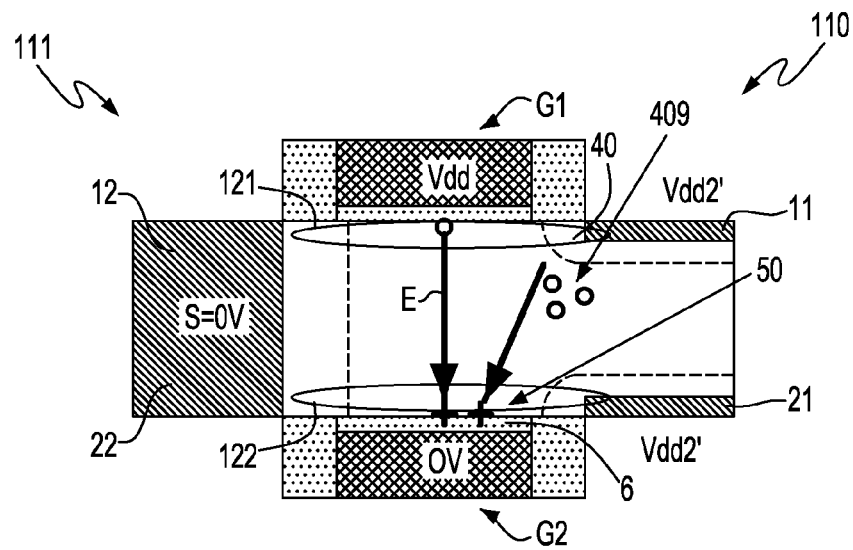

FIGS. 2A-2C are schematic views depicting the operation of a memory cell 111 including a 2-T SRAM cell structure in write mode. Referring to FIGS. 2A and 2B, writing a value to the memory cell 111, i.e., memory device 110, includes applying a first voltage to the first field effect transistor 10 and a second voltage to the second field effect transistor 20. In one embodiment, when the voltage applied to the first field effect transistor 10 is greater than the voltage that is applied to the second field effect transistor 20, and the voltage that is applied to the first field effect transistor 10 is greater than the threshold voltage of the first field effect transistor 10, a "1" is written to the memory cell 111, as depicted in FIG. 2A. In one embodiment, when the voltage applied to the second field effect transistor 20 is greater than the voltage applied to the first field effect transistor 10, and the voltage that is applied to the second field effect transistor 20 is greater than the threshold voltage of the second field effect transistor 20, a "0" is written to the memory cell 111, as depicted in FIG. 2B.

Referring to FIG. 2A, when the voltage that is applied to the first field effect transistor 10 performs a write operation for a "1" value, the operating voltage (Vdd) is applied to the gate structure GI of the first field effect transistor 10, which is greater than the threshold voltage of the first field effect transistor 10 and is greater than the voltage that is applied to the second field effect transistor 20, wherein the voltage applied to the gate structure G2 of the second field effect transistor 20 may be on the order of approximately 0V. In one embodiment, the operating voltage (Vdd) is lower than the voltage (Vdd2') that is measured from the drain 11 of the first field effect transistor 10, wherein the voltage of the drain of the device may be measured by employing resistors 4.

The operating voltage (Vdd) for a write operation for a "1" value may range from about 0.7V to about 1.3V, when the threshold voltage (Vt) of the first field effect transistor 10 ranges from about 0.2V to about 0.4V. In another embodiment, the operating voltage (Vdd) for a write operation for a "1" value may range from about 0.7V to about 1.3V, when the threshold voltage (Vt) of the first field effect transistor 10 ranges from about 0.2V to about 0.4V.

Referring to FIG. 2B, when the voltage that is applied to the second field effect transistor 20 performs a write operation for a "0", the operating voltage (Vdd) is applied to the gate structure G2 of the second field effect transistor 20, which is greater than the threshold voltage for the second field effect transistor 20 and is greater than the voltage that is applied to the first field effect transistor 10, wherein the voltage that is applied to the gate structure G1 of the first field effect transistor 10 may be on the order of approximately 0V. In one embodiment, the operating voltage (Vdd) is lower than the voltage (Vdd2') measured from the drain 21 of the second field effect transistor 20, wherein the voltage of the drain of the device may be measured by employing resistors 4.

The operating voltage (Vdd) for a write operation for a "0" value may range from about 0.7V to about 1.3V, when the threshold voltage (Vt) of the second field effect transistor 20 ranges from about 0.2V to about 0.4V. In another embodiment, the operating voltage (Vdd) for a write operation for a "0" value may range from about 0.7V to about 1.3V, when the threshold voltage (Vt) of the second field effect transistor 20 ranges from about 0.2V to about 0.4V.

Referring to FIG. 2C, in one embodiment when the voltage that is applied to the first field effect transistor 10 is greater than the threshold voltage of the first field effect transistor 10, holes 409 are produced that are collected in a second trap 50 of the second field effect transistor 20 on about an interface of the gate structure G2 of the second field effect transistor 20 in the device region 120 of the substrate 49 in which the second active region 122 is present. More specifically, the second trap 50 is positioned at an interface of a gate dielectric 6, such as an oxide gate dielectric, of the second gate structure G2 and the surface of the second active region 122, such as a Si-containing surface.

In one embodiment, the holes 409 that are collected in the second trap 50 of the second field effect transistor 20 increases the threshold voltage (Vt) of the second field effect transistor 20 to be greater than the first threshold voltage (Vt) of the field effect transistor 10.

The holes 409 that are collected in the second trap 50 of the second field effect transistor 20 may be produced from impact ionization within the first field effect transistor 10 and are released from a first trap 40 positioned at a first interface of the gate structure G1 of the first field effect transistor 10 and the surface of the first active region 121. More specifically, in one embodiment, first trap 40 is position at about an interface of a gate dielectric 6, such as an oxide gate dielectric, of the first gate structure G1 and the surface of the first active region 121, such as a Si-containing surface.

Still referring to FIG. 2C, an electric field E may be produced by a voltage differential between the voltage that is applied to the first field effect transistor 10 and the voltage that is applied to the second field effect transistor 20 directs the holes 409 from the first field effect transistor 10 to the second trap 50 of the second field effect transistor 20. In one embodiment, the voltage differential is provided by a voltage that is applied to the gate structure G1, i.e., a gate conductor, of the first field effect transistor 10 that is greater than the voltage that is applied to the gate structure G2 of the second field effect transistor 20, wherein the voltage that is applied to the first field effect transistor 10 is greater than the threshold voltage (Vt) of the first field effect transistor 10 and performs a write operation for a "1" value. In one embodiment, in which the electric field directs the holes 409 from the first field effect transistor 10 to the second trap 50 of the second field effect transistor 20, the holes 409 that collect at the second trap 50 produce a positively charged surface (+), which increases the threshold voltage of the second field effect transistor 20 to be greater than the threshold voltage of the first field effect transistor 10.

It is noted that FIG. 2C depicts a write operation for a "1" value and that a write operation for a "0" value may be provided by employing the inverse relationship of the voltages that are being applied to the gates structures G1, G2 of the first field effect transistor 10 and the second field effect transistor 20, as depicted in FIG. 2C. More specifically, in one embodiment in which a "0" value is being written to the inventive memory device 110, the voltage that is applied to the second field effect transistor 20, which is greater than the threshold voltage of the second field effect transistor 20 and is greater than the voltage that is applied to the first field effect transistor 10, creates a voltage differential that produces an electric field that directs the holes from the second field effect transistor 20 to the first trap 40 of the first field effect transistor 10.

Figure 3A:
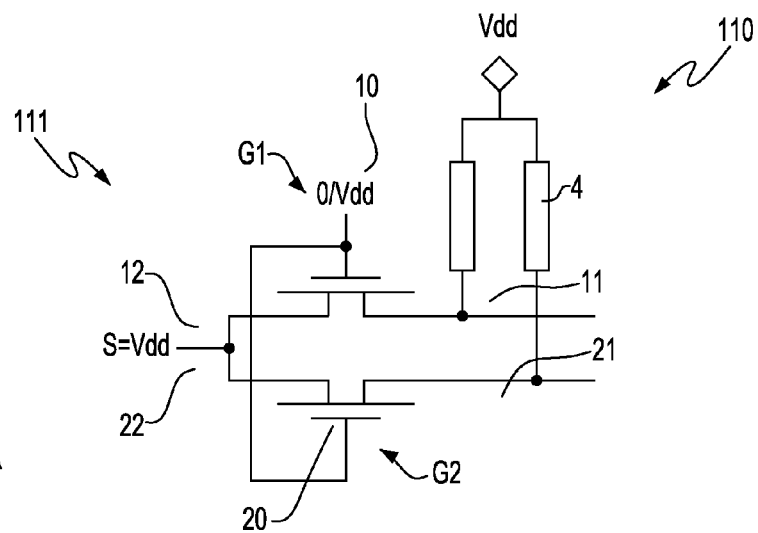
FIGS. 3A-3B are schematic views depicting the operation of one embodiment of a memory cell in hold mode, in accordance with the present invention.
Figure 3B:
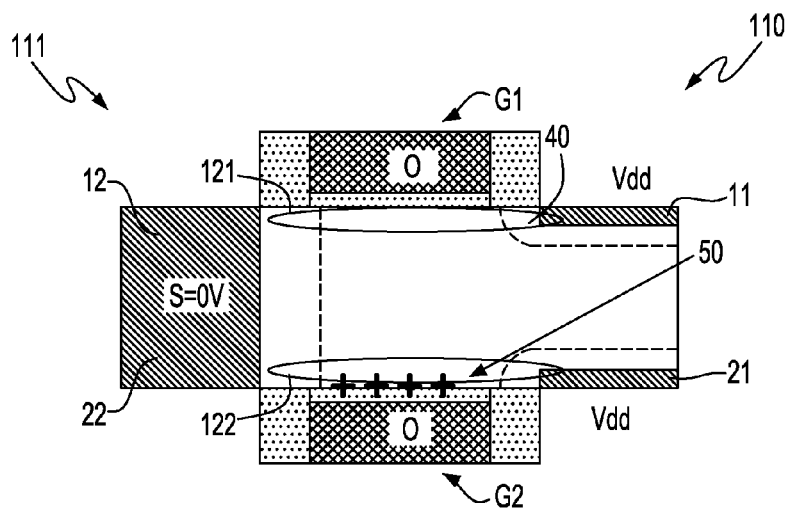

FIGS. 3A and 3B depict the operation of retaining a "1" value by applying a voltage to a first drain 11 of the first field effect transistor 10 and a second drain 21 of the second field effect transistor 20, and applying a voltage to a first gate structure G1 of the first field effect transistor 10 and to a second gate structure G2 of the second field effect transistor 20, wherein the voltage applied to the drain regions 11, 21, is greater than or equal to the voltage applied to the gate structures G1, G2. A value of 0 V may be applied to the gate structures G1, G2. As depicted in FIG. 3A, in the operation of retaining a "1" value, holes remained trapped in the second trap 50 of the second field effect transistor 20, wherein the holes collected at the second trap 50 produce a positively charged surface that increases the threshold voltage of the second field effect transistor 20 to be greater than the threshold voltage of the first field effect transistor 10. It is noted that FIGS. 3A and 3B depict a retaining operation for a "1" value and that a retaining operation for a "0" value may be provided by employing the inverse relationship of the voltages that are being applied to the first field effect transistor 10 and the second field effect transistor 20, as depicted in FIGS. 3A and 3B.

Figure 4A:
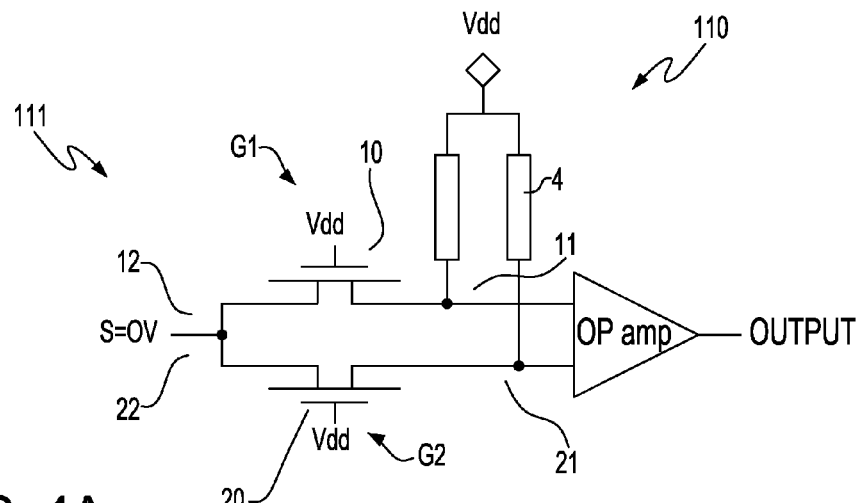
FIGS. 4A-4B are schematic views depicting the operation of one embodiment of a memory cell in read mode, in accordance with the present invention.
Figure 4B:
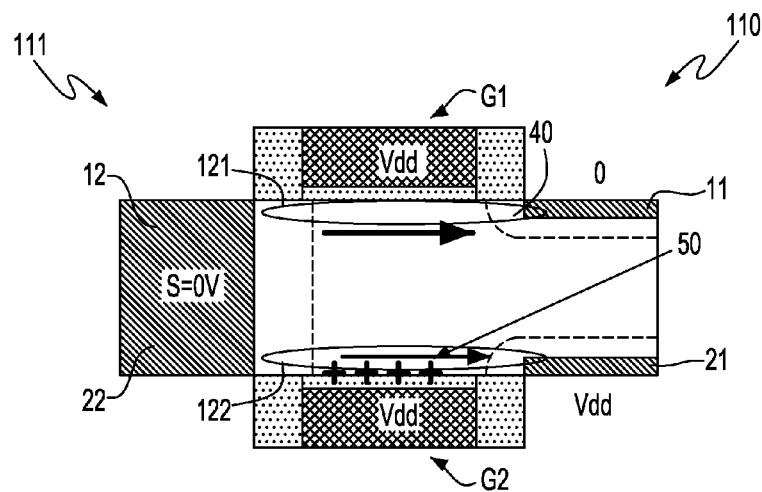

FIGS. 4A and 4B depict one embodiment of reading the value by applying a voltage to the first gate structure G2 and the second gate structure G2, and measuring a first current at the first drain 11 and a second current at the second drain 21, wherein the "1" value is stored in the memory device 110 when the second current at the second drain 21 is less than the first current at the first drain 11, and the "0" value is stored in the memory cell 111 when the first current at the first drain 11 is less than the second current at the second drain 21. When reading a "1" value, as depicted in FIGS. 4A and 4B, the second hole trap 50 being filled with holes increases the threshold voltage of the second field effect transistor 20 so that the second field effect transistor 20 turns on at a higher voltage and flows less current than the first field effect transistor 10. When reading a "0", the first hole trap 40 being filled with holes increases the threshold voltage of the first field effect transistor 10 so that the first field effect transistor 10 turns on at a higher voltage and flows less current than the second field effect transistor 20.

Figure 5:
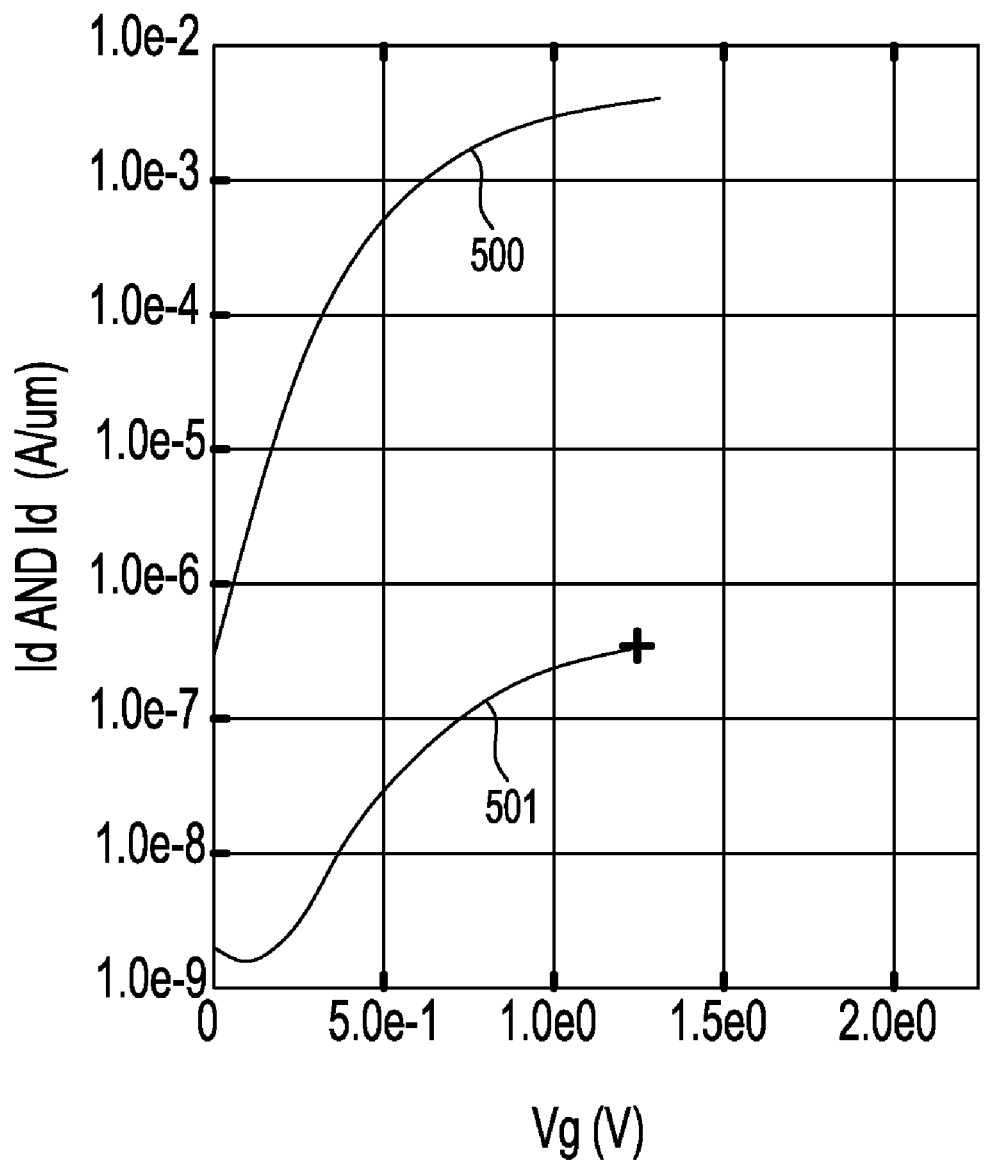
FIG. 5 is a plot of depicting the impact ionization current of one embodiment of a memory device, in accordance with the present invention.

FIG. 5 depicts a plot of the impact ionization rate of one embodiment of an SRAM memory device 110, as provided by the present invention. The x-axis represents voltage having units of V and the y-axis represents current (i.e. drain current (Id) to initiate ionization (reference number 500) or body current (Ib) generated by impact ionization (reference number 501)) having units of A/$\mu$m. In one example of the present invention, the inventive memory device 110 on a 32 nm SOI substrate has an impact ionization current equal to about 0.1 $\mu$A/$\mu$m, which is approximately 1000 times faster than prior flash memory devices.

FIGS. 6A to 14E depict one embodiment of a method of manufacturing a memory device 110. The method provides a memory device 110, in which the memory function of the device is provided by hole traps 40, 50 on the semiconductor isolation region interfaces. Broadly, the method of manufacturing a memory device 110 includes providing a substrate 49; forming at least one device region in the substrate 49; forming at least two gate regions G1, G2 in contact with the at least one device region; forming a common source region 13 for the at least two gate regions G1, G2 to one device region; and forming a first drain region 11 for one of the two gate regions on a first portion of the at least one device region and a second drain region 21 for an other of the two gate regions on a second portion of the at least one device region.

Figure 6A:
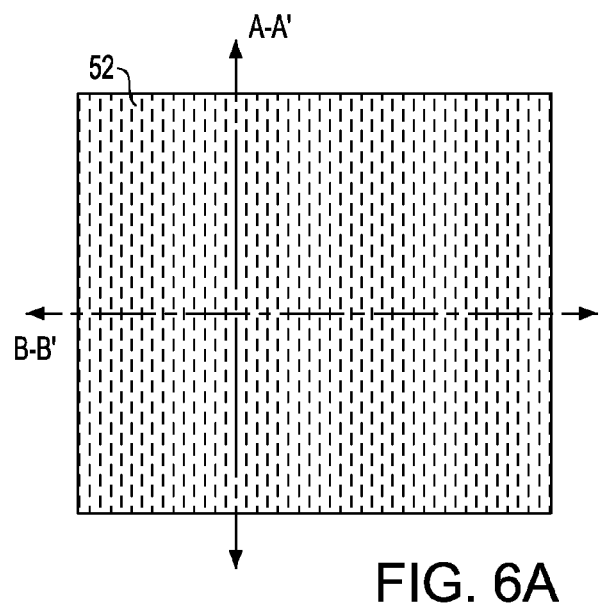
FIGS. 6A-6B depict an initial structure that may be used in one embodiment of a method for forming a memory device including a 2-T SRAM cell structure, in accordance with the present invention.
Figure 6B:
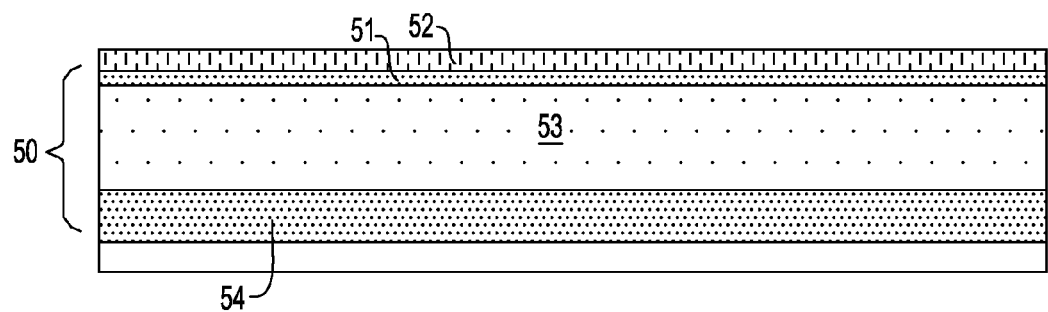

FIGS. 6A and 6B depict the steps of depositing first dielectric layer 51, such as silicon oxide, and a second dielectric layer 52, such as silicon nitride, on a substrate 49, which may also be referred to as a wafer. The substrate 49 may be any silicon on insulator substrate including, but not limited to: silicon-on-insulator substrates (SOI), SiGe-on-insulator (SGOI), and strained-silicon-on-insulator substrates. In another embodiment, the substrate 49 may be composed of bulk Si, single crystal Si, polycrystalline Si, SiGe, amorphous Si, annealed poly Si, and poly Si line structures. The SOI or SGOI substrate 49 may be fabricated using a thermal bonding process, or alternatively be fabricated by an ion implantation process, such as separation by ion implantation of oxygen (SIMOX).

In one embodiment, when the substrate 49 is a silicon-on-insulator (SOI) or SiGe-on-insulator (SGOI) substrate, as depicted in FIGS. 6A and 6B, the thickness of the semiconducting Si-containing layer 53 atop the buried insulating layer 54 can be on the order of about 10 nm or greater. In another embodiment, when the substrate 49 is a silicon-on-insulator (SOI) or SiGe-on-insulator (SGOI) substrate, the thickness of the semiconducting Si-containing layer 53 atop the buried insulating layer 54 can have a thickness on the order of about 20 nm or greater.

The first dielectric layer 51 may be an oxide. The first dielectric layer 51 may be composed of silicon oxide. In one embodiment, the first dielectric layer 51 has a thickness ranging from about 2 nm to about 20 nm. In another embodiment, the first dielectric layer 51 has a thickness ranging from about 2 nm to about 5 nm The first dielectric layer 51 may be deposited using chemical vapor deposition (CVD). Chemical Vapor Deposition is a deposition process in which a deposited species is formed as a result of a chemical reaction between gaseous reactants at greater than room temperature (25° C. to 600° C.), wherein solid product of the reaction is deposited on the surface on which a film, coating, or layer of the solid product is to be formed. Variations of CVD processes include, but is not limited to, Atmospheric Pressure CVD (APCVD), Low Pressure CVD (LPCVD), Plasma Enhanced CVD (EPCVD), Metal-Organic CVD (MOCVD) and combinations thereof may also be employed. Alternatively, the first dielectric layer 51 may be formed by thermal growth, such as thermal oxidation.

The second dielectric layer 52 may be a nitride. In one embodiment, the second dielectric layer 52 is composed of silicon nitride. In one embodiment, the second dielectric layer 52 has a thickness ranging from about 8 nm to about 30 nm. In another embodiment, the second dielectric layer 52 has a thickness ranging from about 2 nm to about 6 nm.

In one embodiment, similar to the first dielectric layer 51, the second dielectric layer 52 is deposited using chemical vapor deposition. In another embodiment, the second dielectric layer 53 may be formed by Molecular Layer Deposition (MLD) or Atomic Layer Deposition (ALD).

Figure 7A:
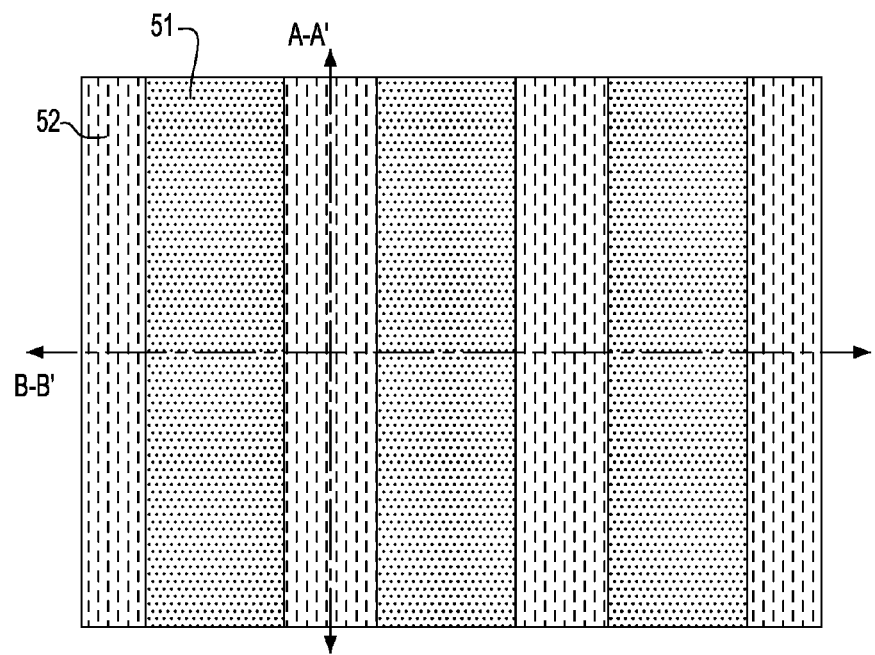
FIGS. 7A-7C depict one embodiment of forming Si-containing islands in the initial structure depicted in FIGS. 6A-6B, in accordance with the present invention.
Figure 7B:
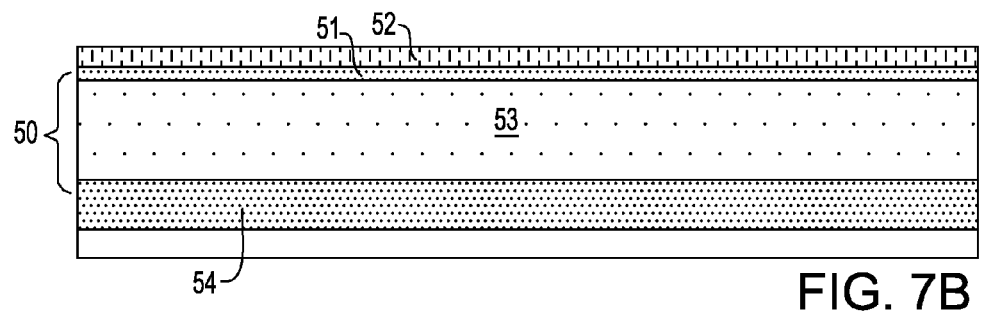
Figure 7C:
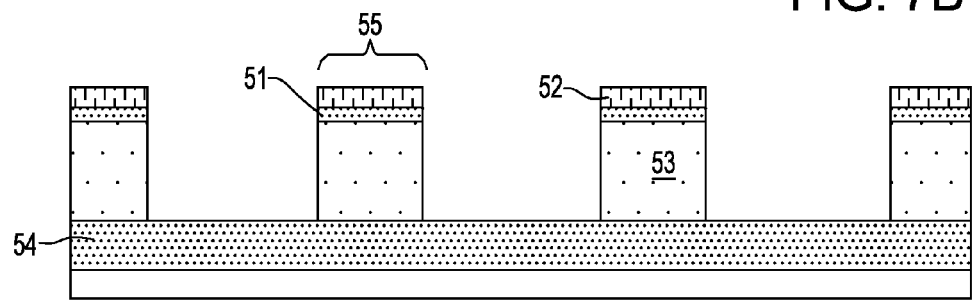

FIGS. 7A-7C depict one embodiment of forming of the at least one device region 120. The step of forming the device region 120 in a Si-containing substrate 49 includes etching the Si-containing substrate 49 to provide at least one Si-containing island 55, as depicted in FIG. 7C, which depicts a side cross-sectional view along section line B-B of the FIG. 7A. FIG. 7B depicts a side cross sectional view along section line A-A of FIG. 7A, which illustrates the cross section along the length of a single Si-containing island 55.

The device region 120 may be provided by etching through the second dielectric layer 52, the first dielectric layer 51, and the semiconducting Si-containing layer 53 stopping on the buried insulating layer 54 to provide Si-containing islands 55. The Si-containing islands 55 may be formed using photolithography and etch processes. The lithographic step may include applying a photoresist to the second dielectric layer 52, exposing the photoresist to a pattern of radiation, and developing the pattern into the exposed photoresist utilizing a resist developer. The etching step used in providing the Si-containing islands 55 may include an anisotropic etch process. An anisotropic etch process denotes a material removal process in which the etch rate in the direction normal to the surface to be etched is higher than in the direction parallel to the surface to be etched. In one embodiment, the anisotropic etch process is provided by reactive ion etch (RIE). Reactive ion etching (RIE) is a form of plasma etching in which during etching the surface to be etched is placed on the RF powered electrode, wherein the surface to be etched takes on a potential that accelerates the etching species extracted from a plasma toward the surface to be etched, in which the chemical etching reaction is taking place in the direction normal to the surface. In other embodiments, the etch process may include plasma etching, ion beam etching or laser ablation. Following etching, the photoresist is typically removed from the structure utilizing a resist stripping process, such as an oxygen ash.

The etch process may be a multi-stage etch. In one embodiment, a first etch stage includes an etch chemistry for removing the second dielectric layer 52 selective to the first dielectric layer 51; a second etch stage includes an etch chemistry to remove the first dielectric layer 51 selective to the second dielectric layer 52 and the semiconducting Si-containing layer 53, wherein the previously etched second dielectric layer 52 acts as a mask for the second stage etch; and a third etch stage includes an etch chemistry to remove the semiconducting Si-containing layer 53 selective to the buried insulating layer 54, wherein the previously etched second dielectric layer 52 acts as a mask for the third etch stage. In another embodiment, the etch process may be a single stage etch. In one embodiment, the width of the Si-containing islands 55 ranges from about 20 nm to about 500 nm. In another embodiment, the width of the Si-containing islands 55 ranges from about 50 nm to about 250 nm.

Figure 8A:
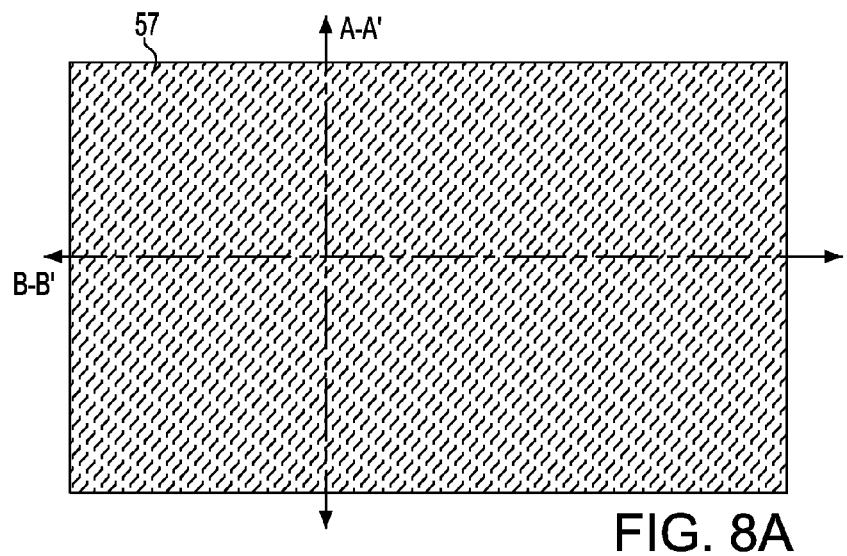
FIGS. 8A-8C depict one embodiment of forming a gate dielectric and depositing a gate conductor material, in accordance with the present invention.
Figure 8B:
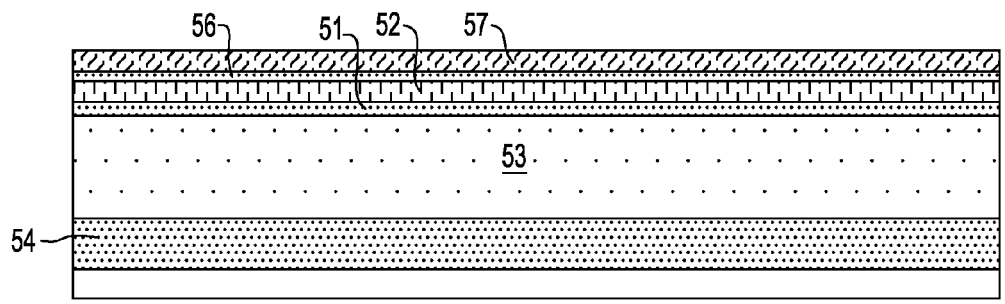
Figure 8C:
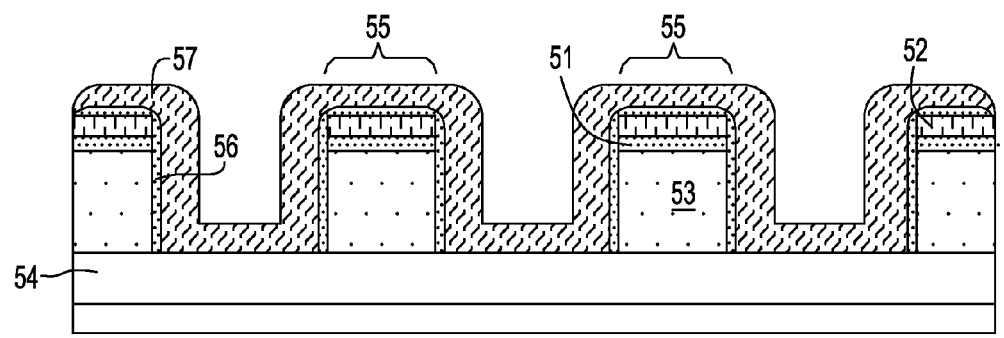

FIGS. 8A-9C depict one embodiment of forming a gate dielectric layer 56 and a gate conductor layer 57 that are subsequently processed to provide the gate structures G1, G2. FIGS. 8A-8C depict one embodiment of forming a gate dielectric layer 56 atop a least one of the Si-containing islands 55 and forming a gate conductor layer 57 atop the gate dielectric layer 56. The gate dielectric layer 56 may be an oxide material and is greater than about 0.8 nm thick. In another embodiment, the gate dielectric layer 56 may have a thickness ranging from about 1.0 nm to about 6.0 nm. The gate dielectric layer 56 may be a high-k gate dielectric comprised of an insulating material having a dielectric constant of greater than about 4.0. The gate dielectric layer 56 is a high-k gate dielectric comprised of an insulating material having a dielectric constant of greater than about 7.0. The gate dielectric layer 56 employed in the present invention may include, but is not limited to: an oxide, nitride, oxynitride and/or silicate including metal silicates and nitrided metal silicates. The gate dielectric layer 56 may be comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. In another embodiment, the gate dielectric layer 56 is a hafnium containing dielectrics. Hafnium containing high-k dielectrics include $HfO_2$, hafnium silicate and hafnium silicon oxynitride.

The gate dielectric layer 56 may be thermally grown. In another embodiment, the gate dielectric layer 56 is deposited. One example of a deposition method for forming the gate dielectric layer 56 is chemical vapor deposition (CVD).

The gate conductor layer 57 may be comprised of polysilicon or a metal. The gate conductor layer 57 is formed atop the gate dielectric layer 56 utilizing a deposition process, such as CVD and/or sputtering. In one embodiment, the gate conductor layer 57 comprises doped polysilicon. The polysilicon dopant can be elements from a group III or a group V of the Periodic Table of Elements. The dopant may be introduced during deposition of the gate conductor layer or following subsequent patterning and etching of the gate conductor layer 57.

Figure 9A:
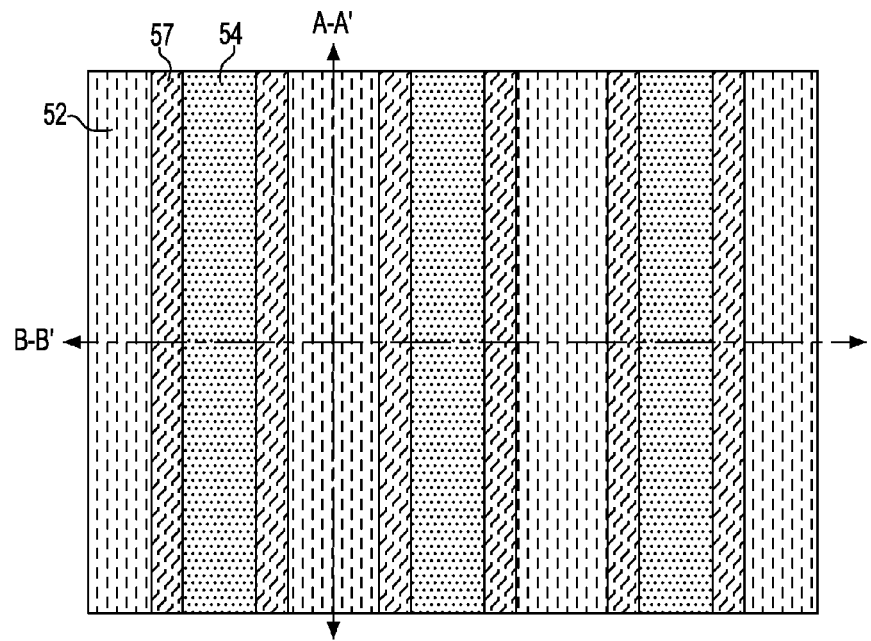
FIGS. 9A-9C depict one embodiment of etching the gate conductor material to provide a gate conductor on both sides of the Si containing islands, in accordance with the present invention.
Figure 9B:
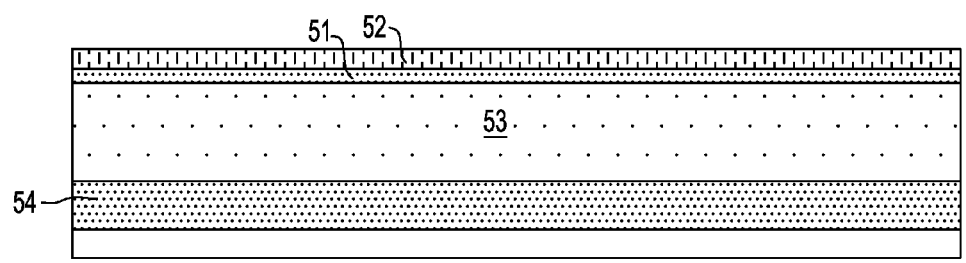
Figure 9C:
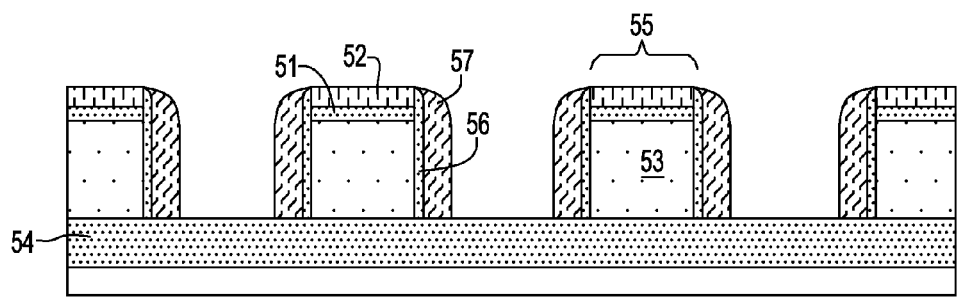

FIGS. 9A-9C depict one embodiment of removing a portion of the gate conductor layer 57 and a portion of the gate dielectric layer 56 that are positioned atop an upper surface of the Si-containing islands 55 to expose the Si-containing island's upper surface, wherein a remaining portion of the gate conductor layer 57 and the gate dielectric layer 56 are positioned on a sidewall of the Si-containing islands 55. The portion of the gate conductor layer 57 and the gate dielectric layer 56 that are positioned atop the upper surface of the Si-containing islands 55 is removed by an anisotropic etch process.

In one embodiment, the remaining portion of the gate conductor layer 57 that is positioned on the sidewall of the Si-containing islands 55 has a width ranging from about 30 nm to about 100 nm. In another embodiment, the remaining portion of the gate conductor layer 57 that is positioned on the sidewall of the Si-containing islands 55 has a width ranging from about 10 nm to about 60 nm.

FIGS. 10A to 10D depict one embodiment of forming of the common dopant region 13 that includes the first source 12 of the first field effect transistor 10 and the second source 22 of the second field effect transistor 20. Forming the common dopant region 13 may include implanting an N-type or P-type dopant via ion implantation. Prior to implanting the dopant for the common dopant region 13, the second dielectric layer 52 may be removed from the area of the structure in which the common dopant region 13 is to be formed using an etch process, such as a selective etch process. In one embodiment, the second dielectric layer 52 may be composed of silicon nitride and is removed selective to a first dielectric layer 51 composed of silicon oxide.

Figure 10A:
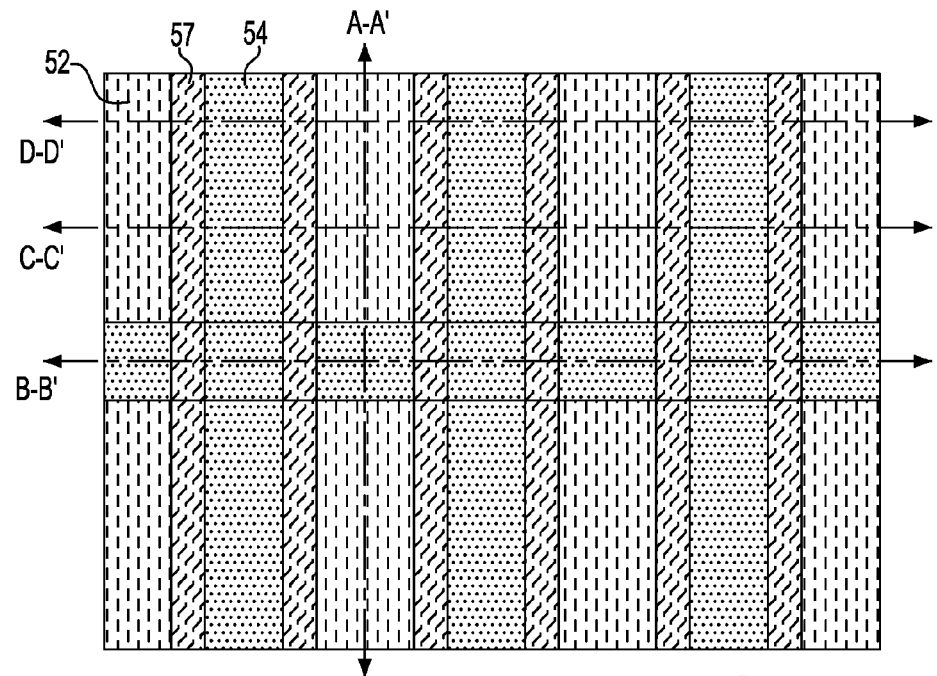
FIGS. 10A-10D depict one embodiment of forming a common source region, in accordance with the present invention.
Figure 10B:
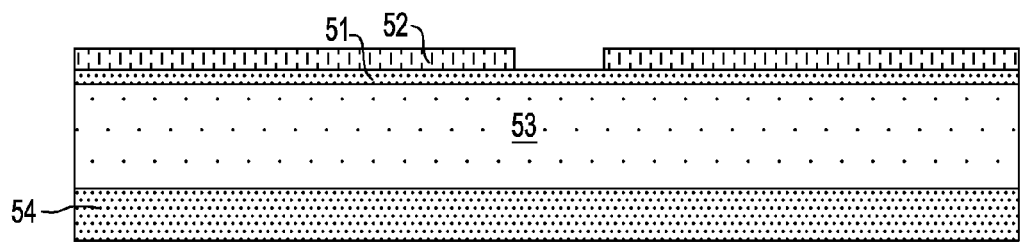
Figure 10C:
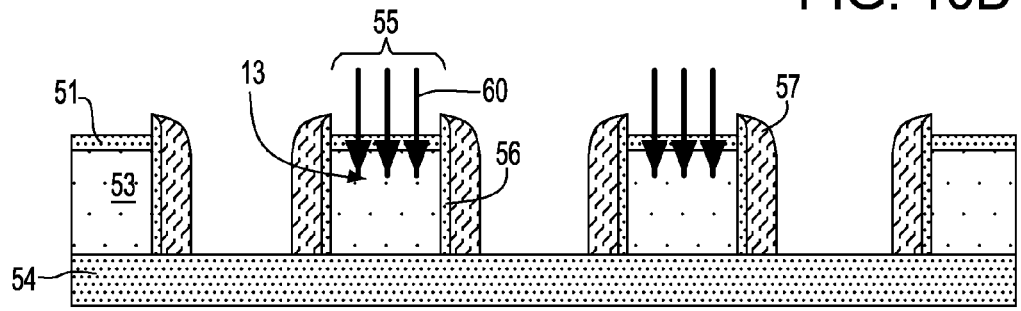
Figure 10D:
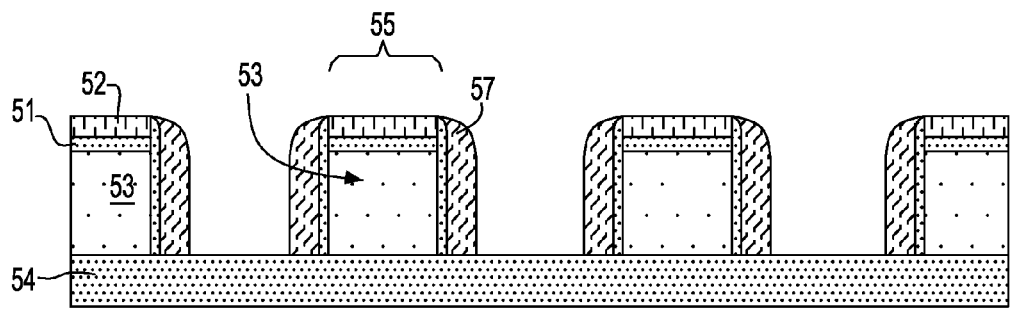

In one embodiment, the second dielectric layer 52 is removed from the silicon islands 55 along section lines A-A and B-B, as depicted in FIGS. 10A-10C. The second dielectric layer 53 may remain atop the structure in section lines C-C, as depicted in FIGS. 10A and 10D, and the second dielectric layer 52 remains atop the structure in section lines D-D, wherein the side cross-sectional view along section line D-D is equal to the side cross-sectional view along section line C-C.

In a following process step, dopants 60 are introduced to the common dopant region 13 using ion implantation. Referring to FIG. 10C, the dopants 60 may be implanted through the first dielectric layer 51 that is positioned atop the Si-containing island 55. PFET devices are produced within the semiconducting Si-containing layer 53 of the Si-containing island 55 by doping with elements from group III of the Periodic Table of Elements. NFET devices are produced within semiconducting Si-containing layer 53 of the Si-containing island 55 by doping with elements from group V of the Periodic Table of Elements. In one embodiment, the implant energy may range from about 15 KeV to about 30 KeV. In another embodiment, the implant energy may range from about 5 KeV to about 10 KeV. An activation anneal may be conducted at a temperature ranging from about 850° C. to about 1350° C.

Figure 11A:
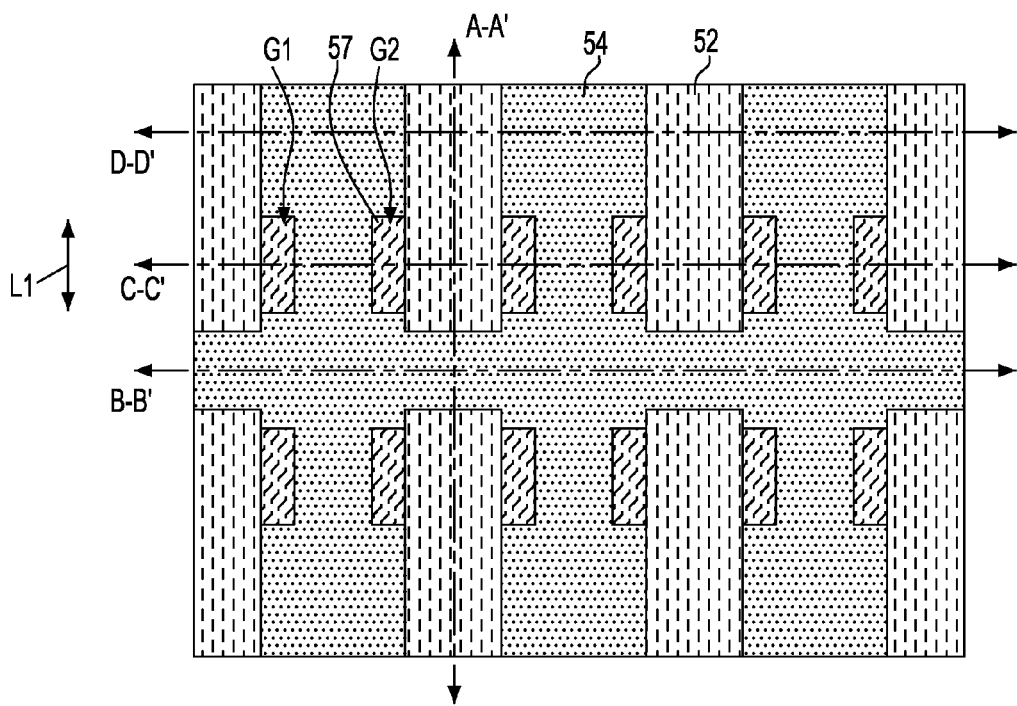
FIGS. 11A-11E depict one embodiment of etching the gate conductor material to define the gate length, in accordance with the present invention.
Figure 11B:
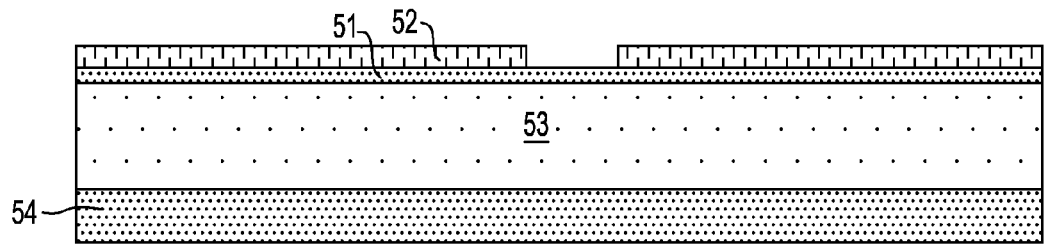
Figure 11C:
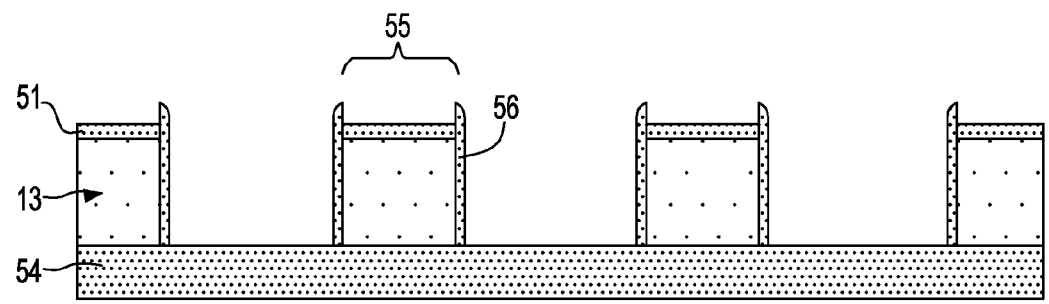
Figure 11D:
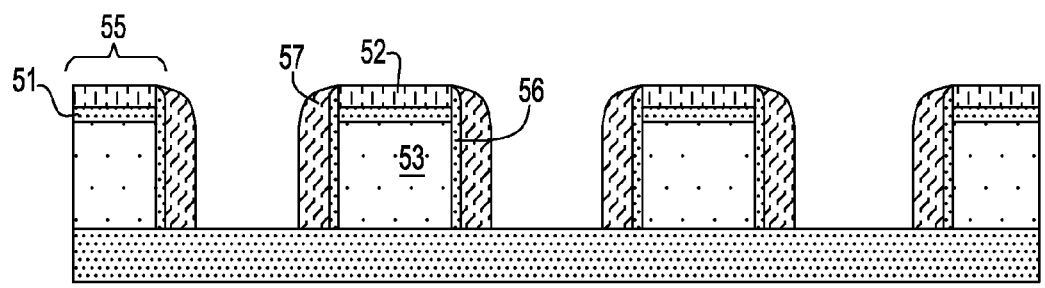
Figure 11E:
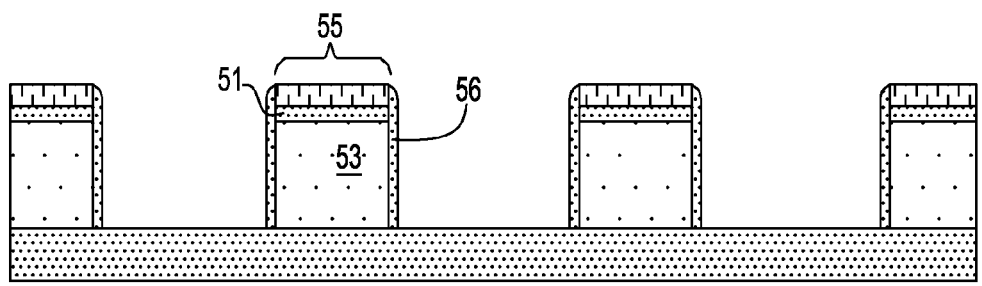

FIGS. 11A to 11E depict one embodiment of forming a first drain region 11 for first gate structure G1 on a first portion of the device region and a second drain region 21 for a second gate structure G2 on a second portion of the device region. In a first process step of one embodiment of the present invention, a selective etch process in combination with a patterned photomask (not shown) removes the gate conductor 57 from the silicon containing islands 55 present in section lines B-B, as depicted in FIG. 11C, and section line D-D, as depicted in FIG. 11E, to define the gate length of the first gate structure G1 and the second gate structure G2, as depicted in FIG. 11A.

More specifically, in one embodiment, the patterned photomask (not shown) is produced by applying a photoresist to the surface to be etched, exposing the photoresist to a pattern of radiation, and then developing the pattern into the photoresist utilizing conventional resist developer to produce the patterned mask. Once the patterning of the photoresist is completed, the sections of the gate conductor 57 covered by the patterned photomask are protected, while the exposed regions are removed using a selective etching process that removes the unprotected regions. A selective etch process may remove the exposed portions of the gate conductor 57 selective to the second dielectric layer 52 and the buried insulating layer 54. In one embodiment, the gate length L1 may range from about 30 nm to about 60 nm. In another embodiment, the gate length L1 may range from about 20 nm to about 40 nm. In a following process step, the patterned photomask may be removed by a chemical strip process.

Figure 12A:
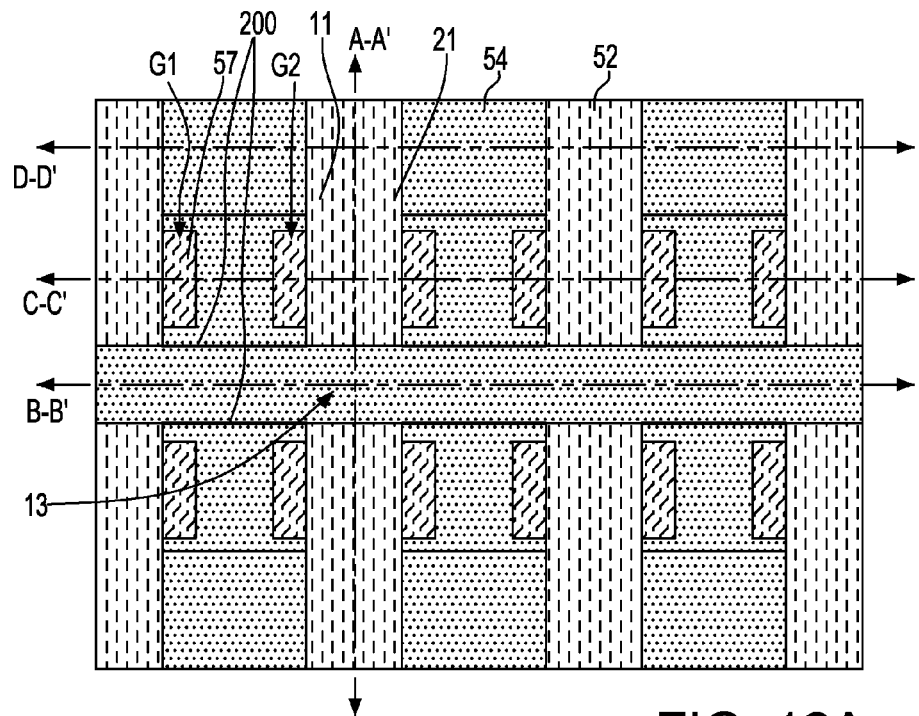
FIGS. 12A-12E depict one embodiment of implanting a drain region, in accordance with the present invention.
Figure 12B:
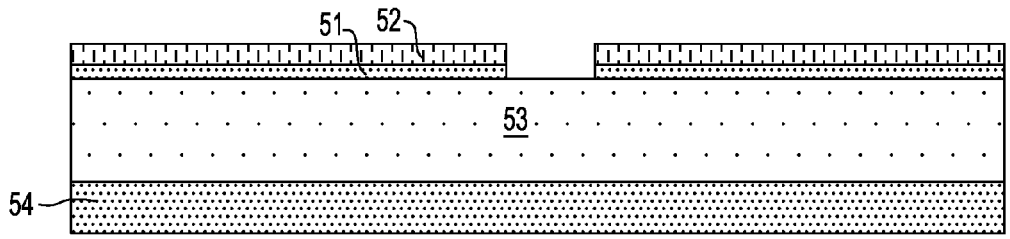

FIGS. 12A-12E depict one embodiment of forming a first drain region 11 on a first portion of the device region and a second drain region 21 on a second portion of the device region. In a first step, a selective etch, such as reactive ion etching, exposes a Si-containing surface of the Si-containing island 55 in which the source and drain regions of the device are to be subsequently formed via ion implantation. Prior to etching a protective photomask is formed atop the portion of the device region in which the gate structures G1, G2 are present, wherein the photomask boundaries having reference number 200 are depicted in FIG. 12A. The protective photomask is similar to the photomask used to provide the gate structures G1, G2, as described above. Following the formation of the protective photomask, the first dielectric layer 51 may be removed from the portions of the Si-containing islands 55 to provide an exposed Si-containing surface, as depicted in FIGS. 12A, 12B, 12C, and 12E.

Figure 12C:
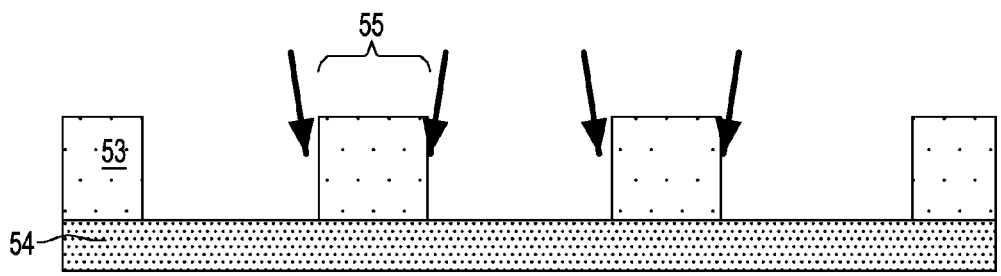
Figure 12D:
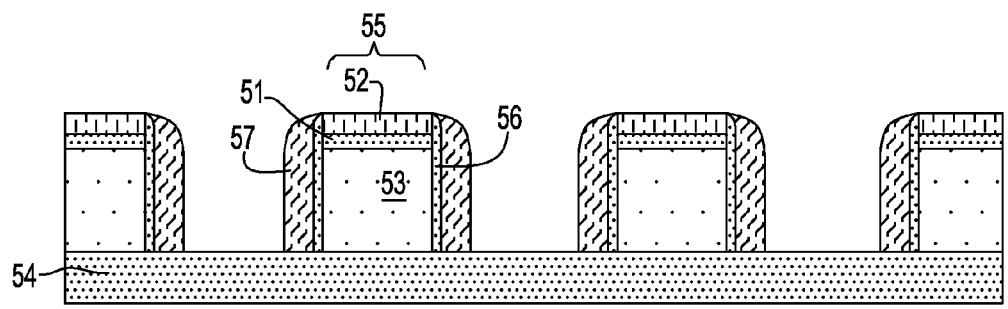
Figure 12E:
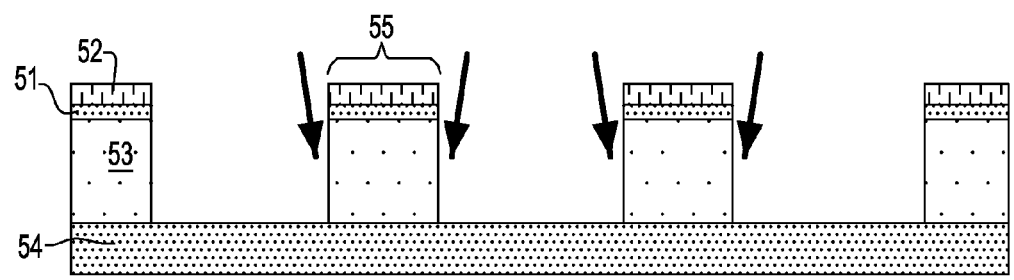
Figure 13A:
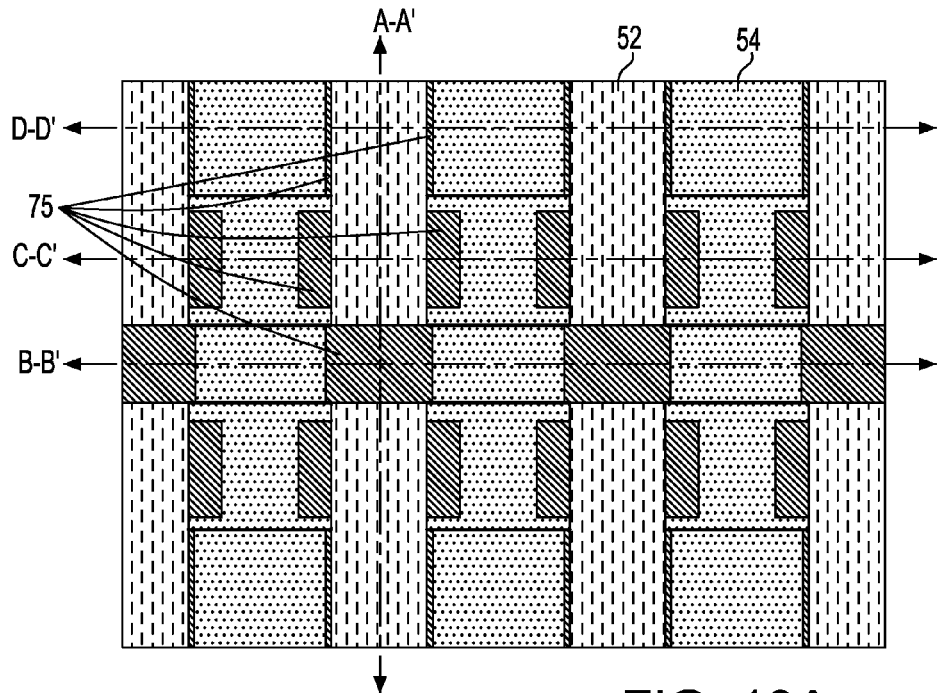
FIGS. 13A-13E depict one embodiment of forming a silicide to the gate, source and drain regions of a memory device, in accordance with the present invention.
Figure 13B:
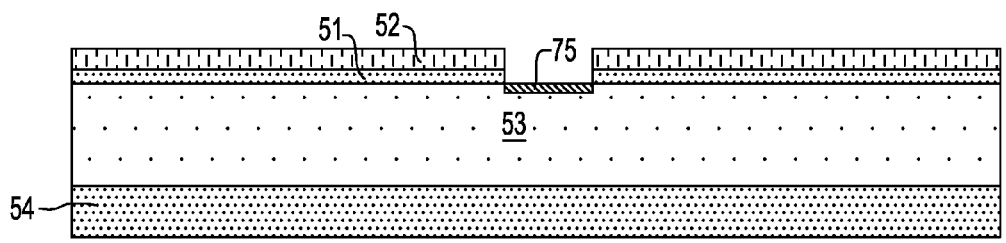
Figure 13C:
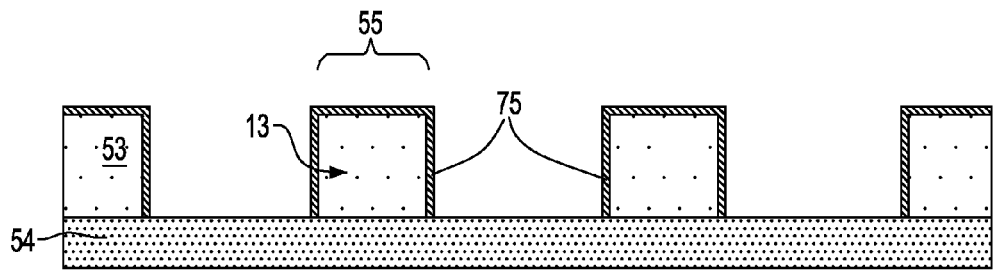
Figure 13D:
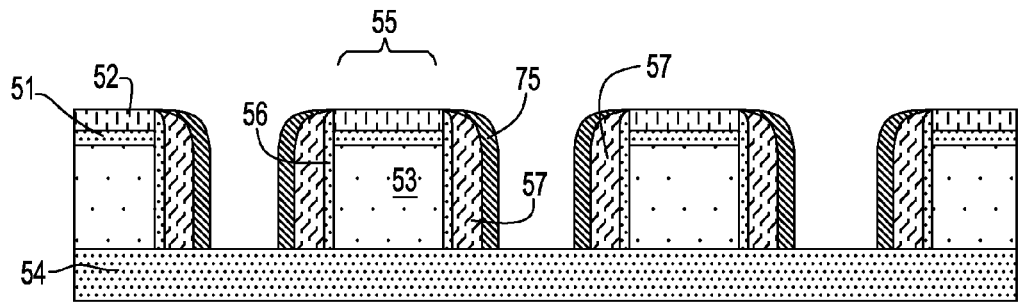
Figure 13E:
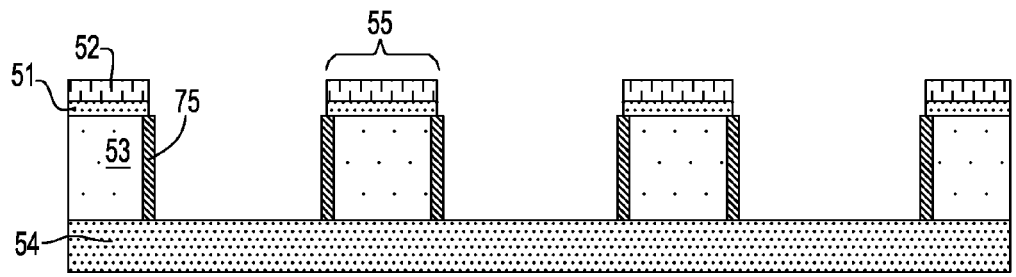
Figure 14A:
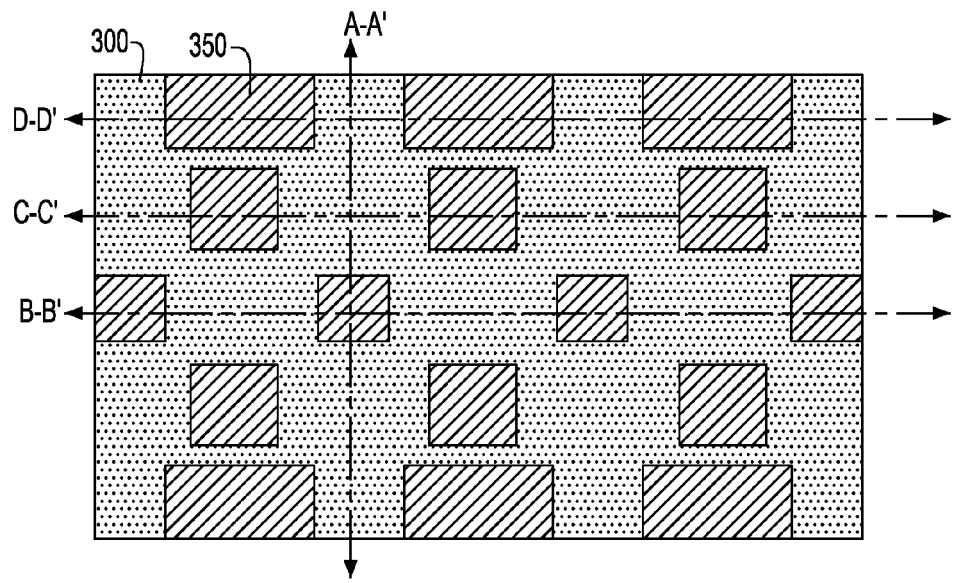
FIGS. 14A-14E depict one embodiment of process sequence for providing contacts to the source, drain and gate structures of the device, in accordance with the present invention.
Figure 14B:
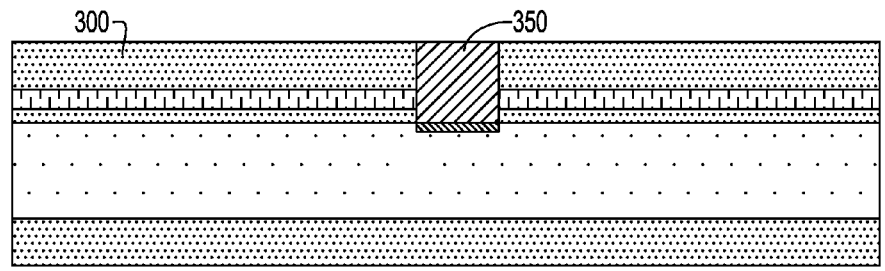
Figure 14C:
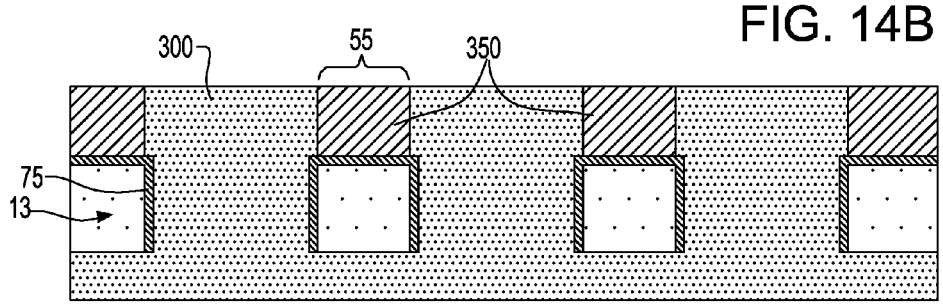
Figure 14D:
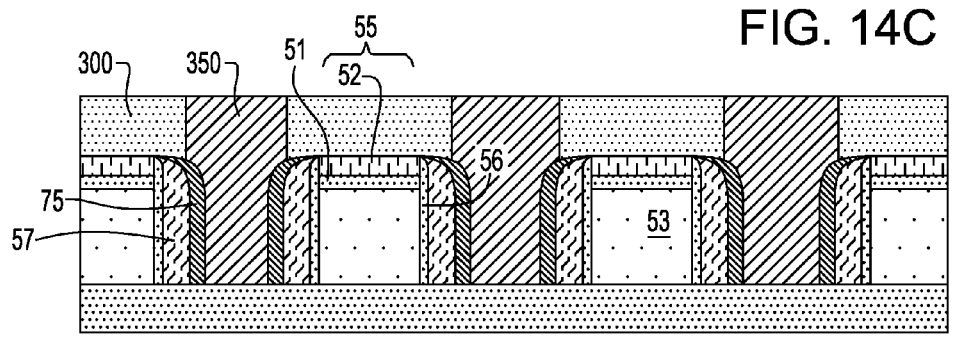
Figure 14E:
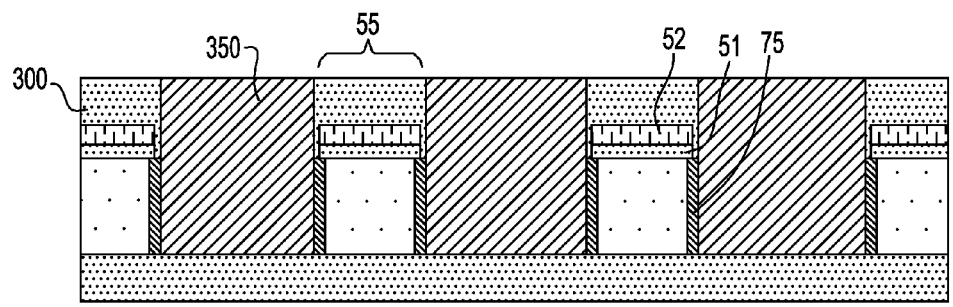

In a following process step, the exposed Si-containing surface of the Si-containing islands 55 is doped 70 to provide a first drain region 11 for a first gate structure G1 on a first portion of the device region and a second drain region 21 a second gate structure G2 on a second portion of the device region. The dopants 70 may be implanted into the Si-containing surface 63 of the Si-containing islands 55 via ion implantation to provide the first drain region 11 and the second drain region 21, as depicted in FIG. 12E. PFET devices are produced within the exposed semiconducting Si-containing surface 63 of the Si-containing island 55 by implanting elements from group III of the Periodic Table of Elements. NFET devices are produced within the exposed semiconducting Si-containing surface 63 of the Si-containing island 55 by implanting elements from group V of the Periodic Table of Elements. In one embodiment, the implant energy may range from about 3 KeV to about 5 KeV. In another embodiment, the implant energy may range from about 0.5 KeV to about 3 KeV. The gate structures G1, G2 may be protected from being doped during ion implantation of the drain regions by an overlying photomask (not shown), as depicted in FIG. 12D. The source region of the device may also be doped by ion implantation at this stage of the inventive method, as depicted in FIG. 12C.

Referring to FIGS. 13A-13E, in a next process step, a silicide 75 is formed atop the source regions 13, 12, 22, the drain regions 11, 21, and the gate structures G1, G2. Silicide 75 formation typically requires depositing a refractory metal, such as Ni or Ti, onto the surface of a Si-containing material or wafer. Following deposition, the structure is then subjected to an annealing step using conventional processes such as, but not limited to, rapid thermal annealing. During thermal annealing, the deposited metal reacts with Si forming a metal silicide. Following silicidation, the unreacted metal may be removed by a selective etch.

Following silicide formation, a layer of dielectric material 300 is blanket deposited atop the entire substrate 49 and planarized. The blanket dielectric 300 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™ as provided by DOW Chemical Company; other carbon-containing materials; organo-inorganic materials such as spin-on glasses and silsesquioxane-based materials; and diamond-like carbon (DLC, also known as amorphous hydrogenated carbon, $\alpha$-C:H). Additional choices for the blanket dielectric 300 include: any of the aforementioned materials in porous form, or in a form that changes during processing to or from being porous and/or permeable to being non-porous and/or non-permeable.

The blanket dielectric material 300 may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The deposited dielectric is then patterned and etched to form via holes to the various source/drain and gate conductor regions of the memory device 110. Following via formation, interconnects are formed by depositing a conductive metal 350 into the via holes using conventional processing, such as CVD or plating. The conductive metal 350 may include, but is not limited to: tungsten, copper, aluminum, silver, gold, and alloys thereof.

In one embodiment, the present invention provides a memory device 110 that is suitable for SRAM applications, in which the memory function is provided by hole traps 40, 50 at a $Si/SiO_2$ interface. In one embodiment, the present invention improves SRAM density by employing 2-T SRAM per cell and providing utilizing optimized routing. In one embodiment, the memory device 110 provides improves stand-by leakage, wherein only the lgd-off contributes to the leakage of the cell. In another embodiment, the present invention improves threshold voltage mismatch and thus provides increased stability. In a further embodiment, by applying a design that utilizes an asymmetrical source and drain layout the present invention enables increased scaling.

In one example, the above-described structures and methods can be employed to provide a 2-T SRAM cell structure that provides approximately 6 Gbits memory in 100×150 $nm^2$/cells on 1.0 $cm^2$ area having a low stand-by leakage stand-by on the order of about 1 pA per cell or less, wherein only edge currents contribute to the leakage of the device.

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed:

1. A memory device comprising:
    a substrate including at least one device region;
    a first field effect transistor having a first threshold voltage, the first field effect transistor including a first active region present in the at least one device region of the substrate, the first active region comprising a first drain and a first source; and
    a second field effect transistor having a second threshold voltage, the second field effect transistor including a second active region present in the at least one device region of the substrate, the second active region comprising a second drain and a second source separated by a second channel region, the second source and the first source are provided by a shared dopant region in the at least one device region, wherein the second channel region includes a second trap that stores holes produced when the first field effect transistor is in the on state, wherein the holes stored in the second trap increase the second threshold voltage to be greater than the first threshold voltage.

2. The memory device of claim 1, wherein the first field effect transistor has a first channel separating the first drain from the first source, wherein the first channel includes a first trap.

3. The memory device of claim 2, wherein the first channel region extends along a first direction defined by the dimension separating the first drain from the first source that is substantially parallel to the second channel region which extends along a second direction defined by the second drain and the second source.

4. The memory device of claim 3, wherein the first field effect transistor includes a first gate structure and the second field effect transistor includes a second gate structure, the first gate structure corresponding to the first channel region is positioned on a first side of the at least one device region, the second gate structure corresponding to the second channel region is positioned on a second side of the at least one device region.

5. The memory device of claim 4, wherein the first active region and the second active region comprise a Si-containing composition.

6. The memory device of claim 5, wherein the second gate structure includes an oxide containing gate dielectric and the second trap is positioned at an interface of the oxide containing gate dielectric and the second active region.

7. The memory device of claim 1, wherein the at least one device region has an area of about 0.015 um$^2$ or less.

* * * * *